(12) United States Patent
Lee et al.

(10) Patent No.: US 11,056,205 B1
(45) Date of Patent: Jul. 6, 2021

(54) MEMORY DEVICE AND WRITE METHOD THEREOF

(71) Applicant: MACRONIX International Co., Ltd., Hsinchu (TW)

(72) Inventors: Ya-Jui Lee, Taichung (TW); Kuan-Fu Chen, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/908,626

(22) Filed: Jun. 22, 2020

(51) Int. Cl.
  *G11C 11/34* (2006.01)
  *G11C 16/34* (2006.01)
  *G11C 16/30* (2006.01)
  *G11C 16/26* (2006.01)
  *G11C 16/10* (2006.01)

(52) U.S. Cl.
  CPC ......... *G11C 16/3481* (2013.01); *G11C 16/10* (2013.01); *G11C 16/26* (2013.01); *G11C 16/30* (2013.01); *G11C 16/3404* (2013.01)

(58) Field of Classification Search
  CPC ............ G11C 16/3454; G11C 16/3459; G11C 11/5628; G11C 16/0483; G11C 2211/5621
  USPC ........................................ 365/185.22, 189.16
  See application file for complete search history.

(56) References Cited

U.S. PATENT DOCUMENTS

| 10,504,586 | B2* | 12/2019 | Shiino | G11C 16/0483 |
| 2008/0170435 | A1* | 7/2008 | Tokiwa | G11C 11/5628 365/185.03 |
| 2010/0046302 | A1* | 2/2010 | Ogura | G11C 11/5642 365/185.21 |
| 2013/0155773 | A1* | 6/2013 | Miyamoto | G11C 16/06 365/185.12 |

* cited by examiner

*Primary Examiner* — Son T Dinh
(74) *Attorney, Agent, or Firm* — J.C. Patents

(57) ABSTRACT

A memory device and a write method thereof are provided. A control circuit performs a first write operation and a first write verification operation on a plurality of memory cells of a non-volatile memory, and after the plurality of memory cells pass the first write verification operation, the control circuit performs a second write verification operation on target memory cells corresponding to at least one target threshold voltage in the plurality of memory cells, and when a failure bit count of the target memory cells is not less than a preset number of bits, the control circuit performs a second write operation and a third write verification operation on the plurality of memory cells.

14 Claims, 2 Drawing Sheets

MEMORY DEVICE AND WRITE METHOD THEREOF

BACKGROUND

Field of the Disclosure

The disclosure is related to an electronic device, and in particular to a memory device and a write method thereof.

Description of Related Art

In recent years, non-volatile memory has been commonly used in various electronic devices, such as personal computers, notebook computers, smart phones, tablet computers and so on. In order to cope with the storage of large amounts of data, memory has been developed to have a larger capacity. The widely used three-dimensional stacked flash memory can effectively increase the storage capacity. However, the random telegraph noise (RTN) property of the three-dimensional stacked components can easily cause the threshold voltage of the memory cells to fluctuate, which in turn causes read error. In addition, the three-dimensional stacked flash memory also has the problem of lateral charge migration. Since the three-dimensional stacked flash memory charge trapping layer is shared between the word lines, the lateral charge migration often generates negative offset of threshold voltage immediately after write operation. The change of the threshold voltage will lead to reduction of reading window, and thus read errors are very likely to occur. Therefore, how to ensure that the threshold voltage distribution curve of the memory cells is as expected is a very important issue.

SUMMARY OF THE DISCLOSURE

The present disclosure provides a memory device and a write method thereof, which can effectively avoid the reduction of reading window and reduce read errors.

The memory device of the disclosure includes a non-volatile memory and a control circuit. The control circuit performs a first write operation and a first write verification operation on a plurality of memory cells of the non-volatile memory. After the plurality of memory cells pass the first write verification operation, the control circuit performs a second write verification operation on target memory cells corresponding to at least one target threshold voltage in the plurality of memory cells. When a failure bit count of the target memory cells is not less than a preset number of bits, the control circuit performs a second write operation and a third write verification operation on the plurality of memory cells.

The disclosure also provides a write method of a memory device. The memory device includes a plurality of memory cells. The write method of the memory device includes the following steps. The first write operation and the first write verification operation are performed on the plurality of memory cells. After the plurality of memory cells pass the first write verification operation, the second write verification operation is performed on the target memory cells corresponding to at least one target threshold voltage in the plurality of memory cells. It is determined whether the failure bit count of the target memory cells is less than a preset number of bits. If the failure bit count of the plurality of the target memory cells is not less than the preset number of bits, the second write operation and the third write verification operation are preformed on the plurality of memory cells.

Based on the above, the control circuit in the embodiment of the disclosure may perform the second write verification operation on the target memory cells corresponding to the at least one target threshold voltage in the plurality of memory cells after the plurality of memory cells passes the first write verification operation. The second write operation and the third write verification operation are performed on the plurality of memory cells when the failure bit count of the target memory cells is not less than the preset number of bits. In this manner, it is possible to effectively improve reduction of the reading window and the possibility of read errors.

In order to make the above features and advantages of the present disclosure more comprehensible, embodiments are described below in detail with the accompanying drawings as follows.

DESCRIPTION OF EMBODIMENTS

Figure 1:
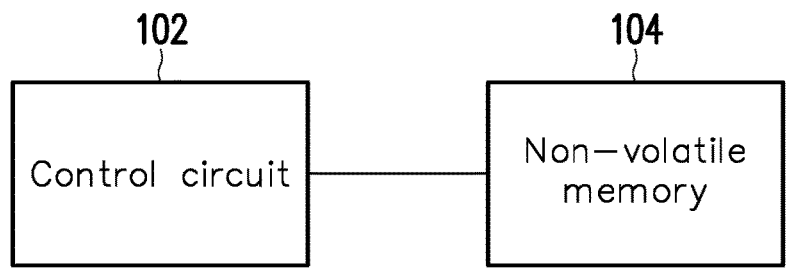
FIG. 1 is a schematic view of a memory device according to an embodiment of the disclosure.

FIG. 1 is a schematic view of a memory device according to an embodiment of the disclosure. Please refer to FIG. 1. The memory device includes a control circuit 102 and a non-volatile memory 104. The non-volatile memory 104 may include a plurality of memory blocks, each of the memory blocks may include a plurality of memory pages, and the control circuit 102 may perform an access operation on the non-volatile memory 104 in units of memory pages, wherein each of the memory pages includes a plurality of memory cells which may be, for example, single-level cells, multi-level cells, triple-level cells or quadruple-level cells.

In this embodiment, taking the triple-level cells as an example, each memory cell can store data of 3 bits. As shown in (A) of FIG. 2, each memory cell can have 8 logic states and a threshold voltage VT1 to VT7 can be used to distinguish the status of the data stored in the memory cells. The control circuit 102 can perform a first write operation and a first write verification operation on the memory cells in the memory page. Furthermore, the control circuit 102 may apply an initial write voltage to the memory cells for data writing, for example, the control circuit 102 may apply write pulses to each memory cell to activate each memory cell move to an expected corresponding voltage value (for example, to or over one of the threshold voltages VT1~VT7). The control circuit 102 may apply a write verification voltage PV for write verification to each memory cell to determine whether each memory cell reaches the expected corresponding threshold voltage value (e.g. VT1, VT3 or other threshold voltages among the threshold voltages VT1~VT7) and, accordingly, determine whether data was correctly written to the memory cells. In this embodiment, the triple-level cells have 8 logic states and each logic state has the corresponding target threshold voltage VT1 to VT7. If some memory cells fail the write verification for the corresponding target threshold voltage, the Incremental Step Pulse Programming (ISPP) voltage may be used to write data again. That is, after each write verification fails, the write voltage is increased by a fixed voltage to perform data writing to the memory cells again until all the memory cells pass the write verification for the corresponding target threshold voltage. After all the memory cells pass the first write verification operation, there is an offset between the actual threshold voltage distribution curve (the distribution curve indicated by the dashed-line) of the memory cells in the memory page and the expected threshold voltage distribution curve (the distribution curve indicated by the solid line). The threshold voltage offsets may occur due to the influence of random telegraph noise and lateral charge migration. It can be seen from (A) of FIG. 2 that, there is a largest threshold voltage offset among the threshold voltage offsets from VT1 to VT7 at the distribution curve (indicated by the dashed-line). The largest threshold voltage offset correlates with the highest threshold voltage VT7 as circled in the box 100. The memory cells correlating with the distribution curve circled in the box 100 may be used as target memory cells. It should be noted that in other embodiments, memory cells correlating with different threshold voltages can also be used as the target memory cells. For example, memory cells distributed between the threshold voltages VT3 and VT4 can be used as the target memory cells. The selection of target memory cells is not limited to the embodiment of (A) of FIG. 2.

The second write verification operation is performed on the target memory cells as previously mentioned. As shown in (B) of FIG. 2, the control circuit 102 may only apply a second write verification voltage PV' to the target memory cells to determine whether the failure bit count (FBC) is less than the preset number of bits (e.g. 5 bits). The second write verification voltage PV' may be less than or equal to the first write verification voltage PV of the first write verification operation. For example, the second write verification voltage PV' may be set to be less than or equal to 500 mV, but the disclosure is not limited thereto. The setting of the second write verification voltage PV' can be adjusted according to actual needs. For example, the voltage value of the second write verification voltage PV' is determined according to the allowable FBC. When the FBC (e.g. 3 bits) is less than the preset number of bits (e.g. 5 bits), the writing method of the memory page is completed.

When the FBC (e.g. 10 bits) is not less than the preset number of bits (e.g. 5 bits), the control circuit 102 may further perform a second write operation and a third write verification operation on all memory cells of the memory page to avoid reduction of the reading window. As shown in (C) of FIG. 2, the threshold voltage distribution curve of the memory cells is changed from the distribution curve shown by the dashed-line to the distribution curve shown by the solid line, such that the possibility of read errors can be reduced. The second write operation and the third write verification operation ensure the threshold voltage distribution curve of the memory cells as expected.

Figure 2:
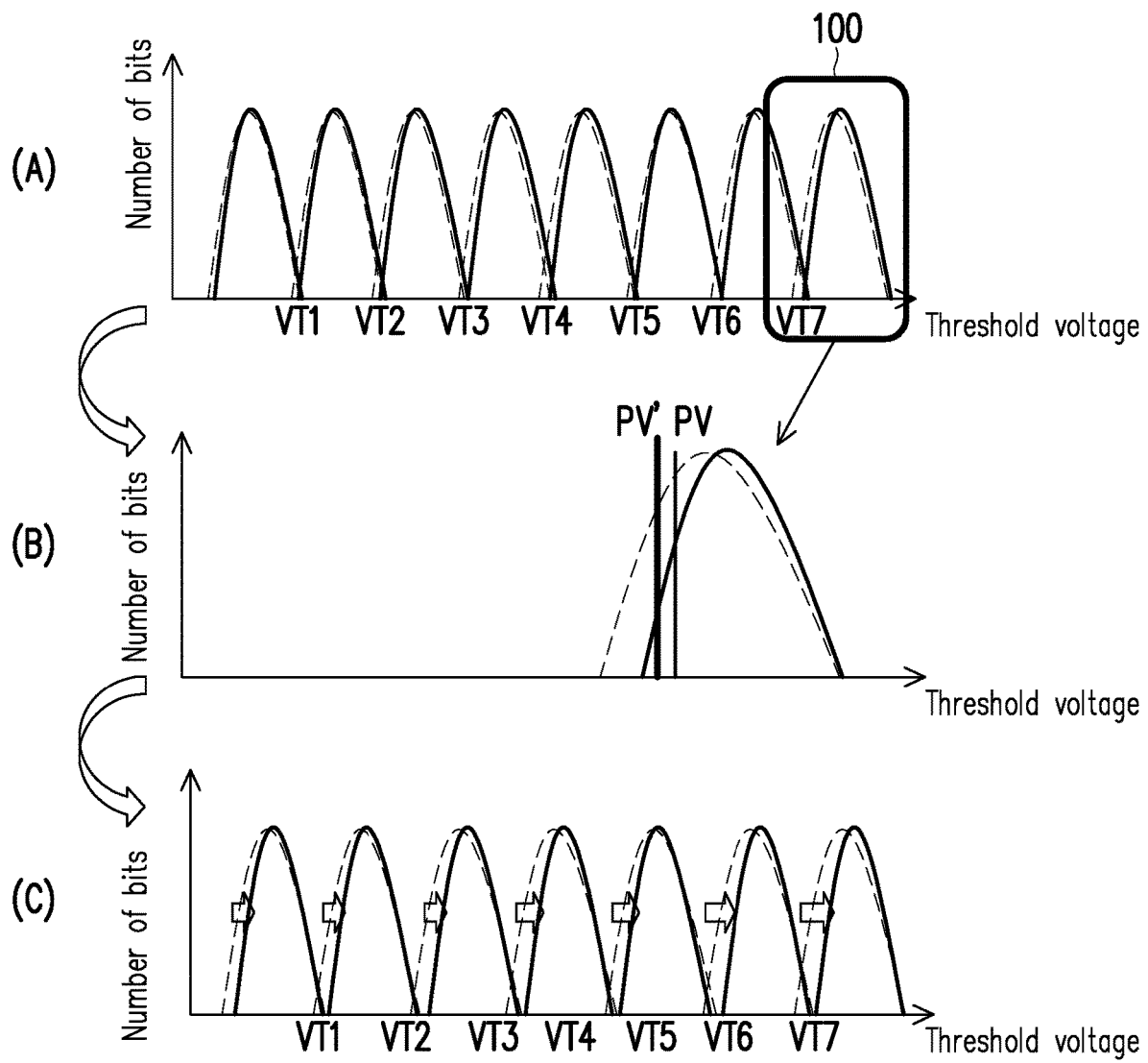
FIG. 2 is a schematic view of a threshold voltage distribution of memory cells according to an embodiment of the disclosure.

As previously mentioned, the target memory cells could be the memory cells with the largest threshold voltage offset in box 100 as shown in (A) of FIG. 2, Hence, the execution of the second write verification only on the target memory cells could determine whether it is necessary to perform the second write operation. In this manner, by performing the second write verification only on the target memory cells, the data writing efficiency of memory page can be effectively improved.

It should be noted that, when performing the second write operation and the third write verification operation, the control circuit 102 can adjust the operation parameters of the second write operation and the third write verification operation according to actual needs. For example, the operation parameters may be adjusted for the second write operation and the third write verification operation according to at least one of the failure bit count of target memory cells and data writing efficiency requirement of the memory cells. The operating parameters may include incremental stepped pulse programming voltage, initial write voltage or write verification voltage, but the disclosure is not limited thereto. For example, when there are more FBC of the target memory cells or data needs to be written in a short time, the voltage values of the incremental step pulse programming voltage and the initial write voltage can be increased. Also, the voltage value of the write verification voltage can be reduced.

Figure 3:
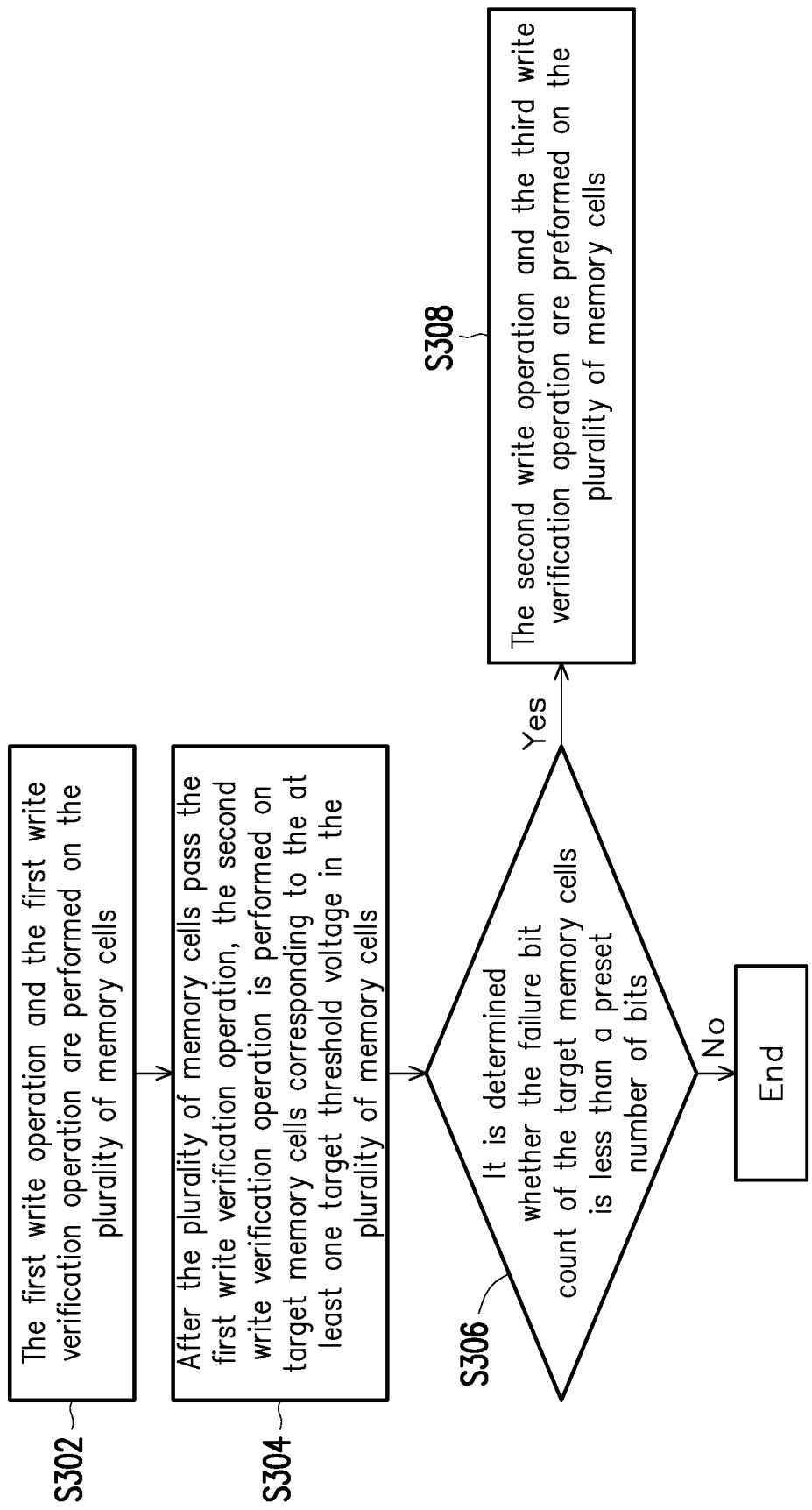
FIG. 3 is a flowchart of a write method of a memory device according to an embodiment of the disclosure.

FIG. 3 is a flowchart of a write method of a memory device according to an embodiment of the disclosure. It can be known from the above embodiments that the write method of the memory device may include the following steps. In step S302, the first write operation and the first write verification operation are performed on the plurality of memory cells. The memory cells may be, for example, single-level cells, multi-level cells, triple-level cells or quadruple-level cells. In step S304, after the plurality of memory cells pass the first write verification operation, the second write verification operation is performed on target memory cells corresponding to at least one target threshold voltage in the plurality of memory cells The at least one target threshold voltage may be the largest threshold voltage among all threshold voltages of the plurality of memory cells. Additionally, the write verification voltage of the second write verification operation may be less than or equal to the write verification voltage of the first write verification operation. For example, the voltage difference between the write verification voltage of the second write verification operation and the write verification voltage of the first write verification operation may be less than or equal to 500 mV. In step 306, it is determined whether the failure bit count (FBC) of the target memory cells is less than a preset number of bits. If the FBC is less than the preset number of bits, the data writing method may be ended. In step 308, if the FBC is not less than the preset number of bits, the second write operation and the third write verification operation may be performed on the plurality of memory cells. Therefore, the threshold voltage distribution curve of the memory cells meets the expectation. When the second write operation and the third write verification operation are performed, the operation parameters of the second write operation and the third write verification operation may be adjusted. The adjustment of the operation parameters could be based on at least one of the FBC of the target memory cells and the data writing efficiency requirement of the plurality of memory cells. For example, incremental step pulse programming voltage, write voltage, write verification voltage and other parameters could be adjusted.

The above embodiments disclose that the control circuit may perform the second write verification operation on the target memory cells corresponding to the at least one target threshold voltage in the plurality of memory cells after the plurality of memory cells passes the first write verification operation. The second write operation and the third write verification operation are performed on the plurality of memory cells when the failure bit count (FBC) of the target memory cells is not less than the preset number of bits. Hence, the actual threshold voltage distribution curve of the plurality of memory cells is formed as the expected threshold voltage distribution curve. The reduction of the reading window and the possibility of read errors could be improved.

Although the present disclosure has been disclosed in the above embodiments, it is not intended to limit the present disclosure, and those skilled in the art can make some modifications and refinements without departing from the spirit and scope of the disclosure. Therefore, the scope of the present disclosure is subject to the definition of the scope of the appended claims.

What is claimed is:

1. A memory device, comprising:
    a non-volatile memory; and
    a control circuit performing a first write operation and a first write verification operation on a plurality of memory cells of the non-volatile memory, wherein after the plurality of memory cells pass the first write verification operation, the control circuit performs a second write verification operation on target memory cells corresponding to at least one target threshold voltage in the plurality of memory cells, when a failure bit count of the target memory cells is not less than a preset number of bits, the control circuit performs a second write operation and a third write verification operation on the plurality of memory cells.

2. The memory device of claim 1, wherein a write verification voltage of the second write verification operation is less than or equal to a write verification voltage of the first write verification operation.

3. The memory device of claim 2, wherein a voltage difference between the write verification voltage of the second write verification operation and the write verification voltage of the first write verification operation is less than or equal to 500 mV.

4. The memory device of claim 1, wherein the at least one target threshold voltage includes a largest threshold voltage among all threshold voltages of the plurality of memory cells.

5. The memory device of claim 1, wherein the control circuit adjusts operation parameters of the second write operation and the third write verification operation according to at least one of the failure bit count of the target memory cells and data writing efficiency requirement of the plurality of memory cells.

6. The memory device of claim 5, wherein the operating parameters of the second write operation and the third write verification operation comprise incremental step pulse programming voltage, write voltage or write verification voltage.

7. The memory device of claim 1, wherein the plurality of memory cells comprise single-level cells, multi-level cells, triple-level cells or quadruple-level cells.

8. A write method of a memory device, the memory device comprising a plurality of memory cells, the write method of the memory device comprising:
    performing a first write operation and a first write verification operation on the plurality of memory cells;
    after the plurality of memory cells pass the first write verification operation, performing a second write verification operation on target memory cells corresponding to at least one target threshold voltage in the plurality of memory cells;
    determining whether a failure bit count of the target memory cells is less than a preset number of bits;
    if the failure bit count of the target memory cells is not less than the preset number of bits, performing a second write operation and a third write verification operation on the plurality of memory cells.

9. The write method of the memory device of claim 8, wherein a write verification voltage of the second write verification operation is less than or equal to a write verification voltage of the first write verification operation.

10. The write method of the memory device of claim 9, wherein a voltage difference between the write verification voltage of the second write verification operation and the write verification voltage of the first write verification operation is less than or equal to 500 mV.

11. The write method of the memory device of claim 8, wherein the at least one target threshold voltage includes a largest threshold voltage among all threshold voltages of the plurality of memory cells.

12. The write method of the memory device of claim 8, comprising:
    adjusting operation parameters of the second write operation and the third write verification operation according to at least one of the failure bit count of the target memory cells and data writing efficiency requirement of the plurality of memory cells.

13. The write method of the memory device of claim 12, wherein the operating parameters of the second write operation and the third write verification operation comprise incremental step pulse programming voltage, write voltage or write verification voltage.

14. The write method of the memory device of claim 8, wherein the plurality of memory cells comprise single-level cells, multi-level cells, triple-level cells or quadruple-level cells.

* * * * *